United States Patent
Meusel et al.

(10) Patent No.: US 12,501,739 B2
(45) Date of Patent: *Dec. 16, 2025

(54) STACKED MONOLITHIC MULTI-JUNCTION SOLAR CELL

(71) Applicant: AZUR SPACE Solar Power GmbH, Heilbronn (DE)

(72) Inventors: Matthias Meusel, Heilbronn (DE); Alexander Berg, Heilbronn (DE); Wolfgang Guter, Stuttgart (DE)

(73) Assignee: Azur Space Solar Power GmbH, Heilbronn (DE)

( * ) Notice: Subject to any disclaimer, the term of this patent is extended or adjusted under 35 U.S.C. 154(b) by 266 days.

This patent is subject to a terminal disclaimer.

(21) Appl. No.: 17/468,367

(22) Filed: Sep. 7, 2021

(65) Prior Publication Data
US 2022/0077342 A1 Mar. 10, 2022

(30) Foreign Application Priority Data
Sep. 7, 2020 (EP) .................................... 20000322

(51) Int. Cl.
H10F 77/42 (2025.01)
H10F 10/142 (2025.01)
(Continued)

(52) U.S. Cl.
CPC ......... H10F 77/488 (2025.01); H10F 10/142 (2025.01); H10F 10/161 (2025.01); H10F 10/163 (2025.01)

(58) Field of Classification Search
CPC ............... H01L 31/068; H01L 31/0725; H01L 31/0735; H10F 10/142; H10F 10/161; H10F 10/63; H10F 77/488; H10F 77/492
See application file for complete search history.

(56) References Cited

U.S. PATENT DOCUMENTS 6,316,715 B1 * 11/2001 King .................. H01L 31/0304
136/261
6,660,928 B1 12/2003 Patton et al.
(Continued)

FOREIGN PATENT DOCUMENTS

CN 107871799 A 4/2018
DE 102005000767 A1 7/2006
(Continued)

OTHER PUBLICATIONS

W. Guter et al: "Space Solar Cells—3G30 and Next Generation Radiation Hard Products" E3S Web of Conferences 16, 2017, pp. 03005-1-03005-6, DOI: 10.1051/e3sconf/20171603005.
(Continued)

*Primary Examiner* — Golam Mowla
(74) *Attorney, Agent, or Firm* — Muncy, Geissler, Olds & Lowe, P.C.

(57) ABSTRACT

A stacked monolithic multi-junction solar cell having at least four subcells, wherein the band gap increases starting from the first subcell in the direction of the fourth subcell, each subcell has an n-doped emitter and a p-doped base, the emitter and the base of the first subcell each have germanium or consist of germanium, all following subcells each have at least one element of main group III and V of the periodic table, a tunnel diode with a p-n junction is placed between each two subcells, all subcells following the first subcell are formed lattice-matched to one another, a semiconductor mirror having a plurality of doped semiconductor layers with alternately different refractive indices is placed between the first and second subcell, and the semiconductor mirror is placed between the first subcell and the first tunnel diode.

22 Claims, 1 Drawing Sheet

(51) Int. Cl.
   *H10F 10/161* (2025.01)
   *H10F 10/163* (2025.01)

(56) References Cited

U.S. PATENT DOCUMENTS

| | | | |
|---|---|---|---|
| 8,716,593 | B2 | 5/2014 | Meusel et al. |
| 10,985,288 | B2 | 4/2021 | Meusel et al. |
| 10,991,840 | B2 | 4/2021 | Ebel et al. |
| 2016/0133775 | A1* | 5/2016 | Fuhrmann ............ H01L 31/0687 136/246 |
| 2017/0186904 | A1 | 6/2017 | Guter et al. |
| 2020/0027999 | A1 | 1/2020 | Derkacs et al. |
| 2020/0203537 | A1* | 6/2020 | Derkacs ................ H01L 31/078 |
| 2020/0251603 | A1* | 8/2020 | McGlynn ............ H01L 31/0687 |

FOREIGN PATENT DOCUMENTS

| | | |
|---|---|---|
| DE | 102014210753 A1 | 12/2015 |
| DE | 102015016047 A1 | 6/2017 |
| DE | 102015016822 A1 | 6/2017 |
| EP | 2251912 A1 | 11/2010 |

OTHER PUBLICATIONS

Steven Wojtczuk: "Bifacial growth InGaP/GaAs/InGaAs concentrator solar cells" IEEE Journal of Photovoltaics, Jul. 2012, vol. 2, No. 3, DOI: 10.1109/JPHOTOV.2012.2189369.

Rao Tatavarti: "InGaP/ GaAs/ InGaAs Inverted Metamorphic (IMM) Solar Cells on 4" Epitaxial Lifted Off (ELO) Wafers IEEE, 2010, pp. 2125-2128.

Andreas W. Bett et al: "Highest Efficiency multi-junction solar cell for terrestrial and space applications" 24$^{th}$ European Photovoltaic Solar Energy Conference, Sep. 21-25, 2009, pp. 1-6.

Jan Schoene: "Control of Strain Relaxation and Defect Formation in Metamorphic III-V Semiconductor Heterostructures for High-Efficiency Solar Cells" 2009.

* cited by examiner

STACKED MONOLITHIC MULTI-JUNCTION SOLAR CELL

This nonprovisional application claims priority under 35 U.S.C. § 119(a) to European Patent Application No. 20000322.6, which was filed in Europe on Sep. 7, 2020, and which is herein incorporated by reference.

BACKGROUND OF THE INVENTION

Field of the Invention

The present invention relates to a stacked multi-junction solar cell.

Description of the Background Art

A stacked monolithic multi-junction solar cell is known, for example, from DE 10 2005 000 767 A1, which corresponds to U.S. Pat. No. 10,985,288. The multi-junction solar cell comprises a first germanium subcell as well as at least two further subcells and at least one semiconductor mirror, wherein the semiconductor mirror has a plurality of layers with refractive indices that at least differ from one another and a high degree of reflection in at least one part of the absorption range of the subcell or subcells placed thereabove and a high transmission degree for radiation in the spectral absorption range of the subcells placed underneath the semiconductor mirror.

DE 10 2015 016 047 A1, which corresponds to U.S. Pat. No. 10,991,840, which is herein incorporated by reference discloses a stacked monolithic III-V multi-junction solar cell having a first germanium subcell and a following second subcell containing indium and phosphorus. If the first and second subcells have different lattice constants, the multi-junction solar cell thus comprises a metamorphic buffer placed between the first and second subcells.

A similar multi-junction solar cell is known from DE 10 2015 016 822 A1, which corresponds to US 2017/0186904, which is incorporated herein by reference.

A stacked metamorphic multi-junction solar cell is known from EP 2 251 912 A1, wherein the tunnel diodes placed between the subcells each have a compressively strained first layer and a tensile strained second layer, so that each tunnel diode as a whole is made to be strain-compensated.

SUMMARY OF THE INVENTION

It is therefore an object of the present invention to provide a device that advances the state of the art.

In an exemplary embodiment, a stacked monolithic multi-junction solar cell is provided that includes a first subcell, a second subcell, a third subcell, and at least one fourth subcell one after the other in the order mentioned, wherein the band gap increases from subcell to subcell starting from the first subcell in the direction of the fourth subcell.

Each subcell has an n-doped emitter and a p-doped base, wherein the emitter and the base of the first subcell each have germanium or consist of germanium and all subcells following the first subcell each have at least one element of main group Ill of the periodic table and an element of main group V of the periodic table.

A tunnel diode with a p-n junction can be placed between two subcells in each case.

All subcells following the first subcell are formed lattice-matched to one another.

A semiconductor mirror having a plurality of n-doped semiconductor layers with alternately different refractive indices is placed between the first subcell and the following second subcell.

An n-doped metamorphic buffer can be placed between the first subcell and the semiconductor mirror, wherein the metamorphic buffer has at least four step layers and at least one overshoot layer.

At least two of the buffer layers can have a doping less than $8 \cdot 10^{17}$ cm$^{-3}$.

A tunnel diode can be placed between two subcells.

It should be noted that the III-V subcells and further layers of the stacked multi-junction solar cell are epitaxially grown one after the other on the Ge subcell, for example, on a Ge substrate.

It should be noted further that the term 'overshoot layer' denotes a layer of the metamorphic buffer that has a larger lattice constant than the lattice constant of the first subcell and a larger lattice constant than the lattice constant of the second subcell or the following subcells.

In the present case, the solar cell can be an upright metamorphic multi-junction solar cell, a so-called UMM solar cell arrangement, without a semiconductor bond or wafer bond. Stated differently, all subcells of the multi-junction cell are grown one after the other epitaxially one on top of the other in a MOVPE system and are not assembled from two substacks.

The first subcell has the smallest band gap and the fourth subcell, in a total of four subcells, the largest band gap. If there are more than four subcells, the top subcell accordingly has the largest band gap.

All subcells can be formed with an n-over-p structure and consequently have an n-doped emitter over a p-doped base.

It is surprising that the efficiency of the multi-junction solar cell increases with a reduction in the doping in the layers of an n-doped metamorphic buffer below a value of $1 \cdot 10^{18}$ cm$^{-3}$.

So far it has been assumed that it is advantageous for the conductivity to select the doping of the buffer layers in a range above $1 \cdot 10^{18}$ cm$^{-3}$.

Furthermore, in order to increase the radiation stability of a subcell for a given subcell thickness, the semiconductor mirror is usually placed directly below the relevant subcell, i.e., directly below the p-doped base of a subcell, and is therefore also made p-doped.

It is understood that a semiconductor mirror can have a plurality of periods made of thin layers, wherein the thin layers alternately have a low and a high refractive index.

A period preferably comprises at least two or three layers, wherein the semiconductor mirror comprises at least 10 layers, i.e., at least 5 periods. In one refinement, the semiconductor mirror comprises at least 10 or at least 15 periods.

In contrast to this, a tunnel diode can be placed between the semiconductor mirror and the subcell above it, therefore, the second subcell, so that the semiconductor mirror is formed n-doped.

Surprisingly, it was found that when the tunnel diode is placed between the p-doped base and the semiconductor mirror, the semiconductor mirror has a significantly higher transmission in relation to the subcells below it with an unchanged good reflection behavior and the efficiency of the multi-junction cell can be increased.

The arrangement formed of n-doping of the layers of the semiconductor mirror in conjunction with a low n-doped metamorphic buffer leads to an increase in the photocurrent in the Ge subcell.

The metamorphic buffer can have at least three semiconductor layers or exactly four or exactly five or exactly six or preferably seven or exactly eight or exactly nine layers. It is understood that the overshoot layers are formed as part of the metamorphic buffer.

The metamorphic buffer can have a lattice constant that changes gradually, e.g., in a step-like or ramp-like manner, from a first lattice constant value to a second lattice constant value.

At least two of the buffer layers of the metamorphic buffer have a doping less than $5 \cdot 10^{17}$ cm$^{-3}$ or less than $3 \cdot 10^{17}$ cm$^{-3}$ or less than $1 \cdot 10^{17}$ cm$^{-3}$ or less than $7 \cdot 10^{16}$ cm$^{-3}$ or less than $4 \cdot 10^{16}$ cm$^{-3}$.

The semiconductor layers of the metamorphic buffer usually comprise or consist of InGaAs. In an example, the overshoot layer has or consists of AlInGaAs in order to increase the transparency for the underlying Ge cell.

It should be noted that the stoichiometry changes from layer to layer of the metamorphic buffer in order to change the lattice constant from layer to layer. The concentration of indium preferably changes from layer to layer in a range between 2% and 5%.

The layers of the metamorphic buffer differ by no more than a factor of 2 in the maximum level of the doping concentration.

The metamorphic buffer can comprise a second overshoot layer.

The layers of the semiconductor mirror can have a doping less than $1 \cdot 10^{19}$ cm$^{-3}$ or less than $5 \cdot 10^{18}$ cm$^{-3}$ or less than $3 \cdot 10^{18}$ cm$^{-3}$ or less than $1.5 \cdot 10^{18}$ cm$^{-3}$ or less than $8 \cdot 10^{17}$ cm$^{-3}$ or less than $5 \cdot 10^{17}$ cm$^{-3}$.

The semiconductor mirror and the layers of the metamorphic buffer can have silicon or tellurium as a dopant.

The layers of the semiconductor mirror with a lower refractive index can have a lower doping and/or a different dopant in contrast to the layers of the semiconductor mirror with a higher refractive index.

The layers of the semiconductor mirror with a lower refractive index can have a lower doping by at least a factor of 2 than the layers of the semiconductor mirror with a higher refractive index.

The layers of the semiconductor mirror with a lower refractive index preferably consist of AlInAs or comprise AlInAs. In an example, the layers of the semiconductor mirror with a lower refractive index do not have any gallium.

The layers of the semiconductor mirror can have a doping greater than $5 \cdot 10^{16}$ cm$^{-3}$ or greater than $1 \cdot 10^{17}$ cm$^{-3}$ or greater than $5 \cdot 10^{17}$ cm$^{-3}$.

At least two of the buffer layers or all buffer layers can have a doping lower than the doping of the layers of the semiconductor mirror.

The multi-junction solar cell can have a fifth subcell.

The second subcell can have InGaAs or consists of InGaAs.

Alternatively or additionally, the third subcell can have GaAs or AlInGaAs or InGaAsP or consists of GaAs or of AlInGaAs or InGaAsP.

The fourth subcell can have AlInGaP or InAlP or consists of AlInGaP or of InAlP.

In addition to the materials mentioned, each solar cell additionally has dopants, e.g., tellurium or silicon, and possibly also impurities.

The multi-junction solar cell can have a fifth solar cell, wherein the fifth subcell is placed between the fourth subcell and the third subcell and has InGaP or consists of InGaP. In one refinement, the fifth subcell is formed on the fourth subcell.

The multi-junction solar cell can have exactly four subcells, wherein the fourth subcell has a band gap between 2.0 eV and 1.8 eV and the third subcell has a band gap between 1.4 eV and 1.6 eV and the second subcell has a band gap between 1 eV and 1.2 eV and the first subcell has a band gap between 0.6 eV and 0.7 eV.

Alternatively, one or more of the subcells can be formed as hetero subcells. Here, the emitter and the base have a different composition of elements. It is understood, however, that the lattice constants of the emitter and base are the same in the respective subcells.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
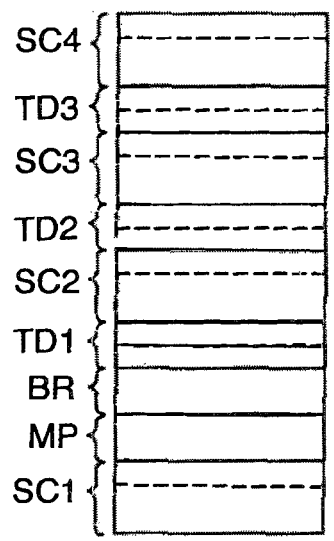
FIG. 1 shows a view of a stacked monolithic multi-junction solar cell.

The diagram in FIG. 1 shows a schematic cross section through a multi-junction solar cell with four monolithic subcells SC1, SC2, SC3, and SC4 arranged in a stack.

Each subcell has a p-doped base B1, B2, B3, or B4 and an n-doped emitter E1, E2, E3, or E4, wherein emitter E1 and base B1 of the first subcell SC1 have or consist of germanium and emitters E2, E3, and E4 and base B2, B3, B4 of subcells SC2, SC3, and SC4 following the first subcell SC1 each have at least one element of main group III and at least one element of main group V.

Each of the further subcells SC2, SC3, and SC4 is formed either as a homo subcell or as a hetero subcell.

Subcells SC1, SC2, SC3, and SC4 have band gaps that increase from subcell to subcell from first subcell SC1 in the direction of fourth subcell SC4.

Second, third, and fourth subcells SC2, SC3, and SC4 are made lattice-matched to one another, whereas first subcell SC1 has a lattice constant different from the lattice constant of the further subcells SC2, SC3, and SC4.

In order to compensate for the difference in the lattice constant, the stacked multi-junction solar cell additionally has a metamorphic buffer MP with lattice constants that change along a height of metamorphic buffer MP.

Metamorphic buffer MP is placed between a top side of first subcell SC1 and a bottom side of semiconductor mirror BR and is n-doped. The lattice constant of metamorphic buffer MP changes, for example, along the height in a ramp-like or step-like manner from a value corresponding to the lattice constants of first subcell SC1 to a value corresponding to the lattice constants of second subcell SC2 and has an overshoot layer, so that the lattice constant first increases from layer to layer and then decreases again to the value of the lattice constant of second subcell SC2.

Metamorphic buffer MP is n-doped and comprises at least four step layers and at least one overshoot layer. At least two of the buffer layers have a doping less than $8 \cdot 10^{17}$ cm$^{-3}$.

The difference in the doping of the metamorphic buffer layers from one another is preferably less than a factor of 2.

A semiconductor mirror BR adjacent to emitter E1 of first subcell SC1 is placed on a top side of first subcell SC1. Semiconductor mirror BR has a plurality of n-doped semiconductor layers with alternately different refractive indices and a dopant concentration in each case of at most $1 \cdot 10^{19}$ cm$^{-3}$ or at most $5 \cdot 10^{18}$ cm$^{-3}$.

A first tunnel diode TD1 with an n-doped layer adjacent to the semiconductor mirror and with a p-doped layer adjacent to second subcell SC2 is placed on a top side of semiconductor mirror BR and adjacent to base B2 of second subcell SC2.

A second tunnel diode TD2 is placed between second subcell SC2 and third subcell SC3 and a third tunnel diode TD3 is placed between third subcell SC3 and fourth subcell SC4, each tunnel diode TD1, TD2, and TD3 having a p-n junction, therefore, an n-doped and a p-doped layer.

Figure 2:
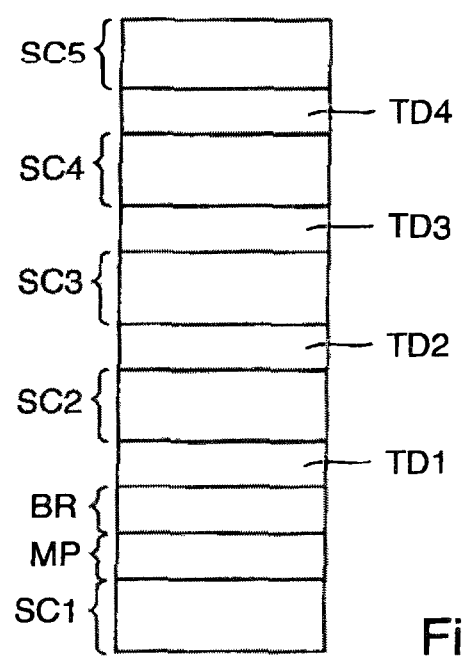
FIG. 2 shows a view of a stacked monolithic multi-junction solar cell.

A further example is shown in the diagram in FIG. 2. Only the differences from the diagram in FIG. 1 will be explained below.

The multi-junction solar cell is formed as a metamorphic five-junction solar cell, wherein the second, third, fourth, and fifth subcells SC2, SC3, SC4, and SC5 are made lattice-matched to one another, wherein first subcell SC1 has a lattice constant that differs from the lattice constant of the following subcells SC2, SC3, SC4, and SC5.

The difference in the lattice constants is compensated for by means of a metamorphic buffer MP placed between first subcell SC1 and semiconductor mirror BR.

In an embodiment that is not shown, the fifth subcell is placed between the fourth subcell and the third subcell and has InGaP or consists of InGaP.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked monolithic multi-junction solar cell comprising:
  a first subcell;
  a second subcell on the first subcell;
  a third subcell on the second subcell;
  a fourth subcell on the third subcell;
  a first tunnel diode arranged between the first and second subcells;
  a second tunnel diode arranged between the second and third subcells;
  a third tunnel diode arranged between the third and fourth subcells, each of the first, second, and third tunnel diodes comprising a p-n junction;
  an n-doped semiconductor mirror having a plurality of doped semiconductor layers with alternately different refractive indices arranged between the first subcell and the second subcell; and
  an n-doped metamorphic buffer arranged between the first subcell and the semiconductor mirror, the metamorphic buffer having at least four step layers and at least one overshoot layer, all layers of the metamorphic buffer having a doping less than $1 \cdot 10^{17}$ cm,
  wherein the first tunnel diode is arranged between the second subcell and the semiconductor mirror so that the metamorphic buffer, the semiconductor mirror, the first tunnel diode and the second subcell are formed in the order mentioned,
  wherein first, second, third, and fourth band gaps are band gaps of the first, second, third, and fourth subcells, respectively, band gaps increasing from the first, second, third, and fourth band gaps in that order,
  wherein each of the first, second, third and fourth subcells has an n-doped emitter and a p-doped base,
  wherein the emitter and the base of the first subcell each comprise germanium,
  wherein each of the second, third, and fourth subcells have at least one element of main group III and V of the periodic table, and
  wherein the second, third, and fourth subcells are formed lattice-matched to one another.

2. The multi-junction solar cell according to claim 1, wherein at least two of the at least four step layers and the at least one overshoot layer of the metamorphic buffer have a doping less than $7 \cdot 10^{16}$ cm$^{-3}$ or less than $4 \cdot 10^{16}$ cm$^{-3}$.

3. The multi-junction solar cell according to claim 1, wherein all of the at least four step layers and the at least one overshoot layer of the metamorphic buffer differ in regard to their doping by no more than a factor of 2.

4. The multi-junction solar cell according to claim 1, wherein the metamorphic buffer has at least two overshoot layers.

5. The multi-junction solar cell according to claim 1, wherein the plurality of doped semiconductor layers of the semiconductor mirror have a doping less than $1 \cdot 10^{19}$ cm$^{-3}$ or less than $3 \cdot 10^{18}$ cm$^{-3}$ or less than $1.5 \cdot 10^{18}$ cm$^{-3}$ or less than $8 \cdot 10^{17}$ cm$^{-3}$ or less than $5 \cdot 10^{17}$ cm$^{-3}$.

6. The multi-junction solar cell according to claim 1, wherein the semiconductor mirror and the metamorphic buffer have silicon or tellurium as a dopant.

7. The multi-junction solar cell according to claim 1, wherein at least one of the plurality of semiconductor layers of the semiconductor mirror with a lower refractive index have a lower doping and/or a different dopant than at least one of the plurality of semiconductor layers of the semiconductor mirror with a higher refractive index.

8. The multi-junction solar cell according to claim 1, wherein the at least one of the plurality of semiconductor layers of the semiconductor mirror with the lower refractive index has the lower doping by at least a factor of 2 than the at least one of the plurality of semiconductor layers of the semiconductor mirror with the higher refractive index.

9. The multi-junction solar cell according to claim 1, wherein at least one of the plurality of semiconductor layers of the semiconductor mirror with a lower refractive index comprises AlInAs.

10. The multi-junction solar cell according to claim 1, wherein the plurality of semiconductor layers of the semiconductor mirror have a doping greater than $5 \cdot 10^{16}$ cm$^{-3}$ or greater than $1 \cdot 10^{17}$ cm$^{-3}$ or greater than $5 \cdot 10^{17}$ cm$^{-3}$.

11. The multi-junction solar cell according to claim 1, wherein at least two of the at least four step layers and the at least one overshoot layer of the metamorphic buffer have a doping lower than the doping of the plurality of semiconductor layers of the semiconductor mirror.

12. The multi-junction solar cell according to claim 1, wherein the fourth subcell has a band gap between 2.0 eV and 1.8 eV and the third subcell has a band gap between 1.4 eV and 1.6 eV and the second subcell has a band gap between 1 eV and 1.2 eV and the first subcell has a band gap between 0.6 eV and 0.7 eV.

13. The multi-junction solar cell according to claim 1, further comprising:
a fifth subcell above the fourth subcell or in between the third subcell and fourth subcell.

14. The multi-junction solar cell according to claim 9, wherein the at least one of the plurality of semiconductor layers of the semiconductor mirror with the lower refractive index comprises no gallium.

15. The multi-junction solar cell according to claim 12, wherein multi-junction solar cell comprises exactly the first, second, third, and fourth subcells.

16. The multi-junction solar cell according to claim 13, wherein the fifth subcell is arranged on the fourth subcell or is arranged between the third and fourth subcells.

17. The multi-junction solar cell according to claim 13, wherein the fifth subcell is lattice-matched to the second, third, and fourth subcells.

18. The multi-junction solar cell according to claim 1, wherein the first tunnel diode comprises:
an n-doped layer; and
a p-doped layer on the n-doped layer,
wherein the n-doped layer is adjacent to the semiconductor mirror, and
wherein the p-doped layer is adjacent to the p-doped base of the second subcell.

19. The multi-junction solar cell according to claim 1, wherein lattice constants of the emitters and the bases of the second, third, and fourth subcells are the same.

20. The multi-junction solar cell according to claim 1, wherein the plurality of doped semiconductor layers of the semiconductor mirror are all n-doped.

21. The multi-junction solar cell according to claim 1, wherein the layers of the metamorphic buffer differ by no more than a factor of 2 in a maximum level of a doping concentration.

22. The multi-junction solar cell according to claim 1, wherein at least two layers of the metamorphic buffer or all layers of the metamorphic buffer have a doping lower than a doping of the plurality of doped semiconductor layers of the semiconductor mirror.

* * * * *